(12) United States Patent
Kadoya

(10) Patent No.: US 8,129,769 B2
(45) Date of Patent: Mar. 6, 2012

(54) SEMICONDUCTOR DEVICE AND MANUFACTURING METHOD THEREOF

(75) Inventor: Tomohiro Kadoya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 254 days.

(21) Appl. No.: 12/638,465

(22) Filed: Dec. 15, 2009

(65) Prior Publication Data

US 2010/0148236 A1    Jun. 17, 2010

(30) Foreign Application Priority Data

Dec. 16, 2008  (JP) .................................. 2008-319721

(51) Int. Cl.
*H01L 27/092*   (2006.01)
(52) U.S. Cl. ................. 257/296; 257/E27.084; 438/618
(58) Field of Classification Search .......... 257/295–296, 257/330–333, E27.084; 438/618
See application file for complete search history.

(56) References Cited

U.S. PATENT DOCUMENTS

| | | | |
|---|---|---|---|
| 6,822,280 B2 | 11/2004 | Ito et al. | |
| 7,026,208 B2 | 4/2006 | Park et al. | |
| 2004/0147114 A1* | 7/2004 | Park et al. | 438/666 |
| 2006/0284224 A1* | 12/2006 | Shuto | 257/295 |
| 2006/0289913 A1* | 12/2006 | Yates et al. | 257/295 |
| 2007/0059647 A1* | 3/2007 | Baik | 430/311 |
| 2007/0241380 A1 | 10/2007 | Hasunuma | |
| 2009/0026515 A1* | 1/2009 | Shin et al. | 257/296 |
| 2009/0194802 A1* | 8/2009 | Fischer | 257/296 |

FOREIGN PATENT DOCUMENTS

| | | | |
|---|---|---|---|
| JP | 2003-142605 A | 5/2003 | |
| JP | 2003-297952 A | 10/2003 | |
| JP | 2007-287794 A | 11/2007 | |

* cited by examiner

*Primary Examiner* — Nathan Ha
(74) *Attorney, Agent, or Firm* — Foley & Lardner LLP

(57) ABSTRACT

A semiconductor device having a $6F^2$ memory cell whose size is defined by a numerical value of a design rule F, wherein: lower electrodes of capacitors included in the memory cell are supported by a support film; the support film is formed as a pattern combining a first support pattern (14x) linearly extending in a first direction and a second support pattern (14y) linearly extending in a second direction that crosses to the first direction; the support film is arranged such that the intervals of the first and second support patterns are both equal to or greater than 1.5F; and the interval of one of the first and second support patterns is greater than the interval of the other one of the first and second support patterns.

15 Claims, 14 Drawing Sheets

SEMICONDUCTOR DEVICE AND MANUFACTURING METHOD THEREOF

BACKGROUND OF THE INVENTION

1. Field of the Invention

The present invention relates to a semiconductor device such as a DRAM (dynamic random access memory) element including a $6F^2$ memory cell whose size is defined by a numerical value of a design rule F. More specifically, the present invention relates to a semiconductor device including a memory cell part having a supporting part for preventing lower electrodes of capacitors of a memory cell part from collapsing and coming into contact with each other.

2. Description of the Related Art

Developments in miniaturization of semiconductor devices have led to smaller areas of memory cells making up a DRAM. Consequently, it is generally practiced that capacitors making up a memory cell be three-dimensionally formed in order to secure sufficient capacitance at the capacitors. Specifically, by providing a lower electrode of a capacitor with a cylindrical shape and using a sidewall of the lower electrode as a capacitor, surface area can be expanded and capacitance can be increased.

The reduction in memory cell area has lead to a reduction in the area of the bottom of lower electrodes of capacitors. As a result, a phenomenon in which a lower electrode falls over and short-circuits an adjacent lower electrode (collapse) is more likely to occur in a manufacturing process for exposing an outer wall of a cylindrical capacitor. In order to prevent such collapsing of electrodes, techniques are proposed in which a support film for providing support is disposed between lower electrodes (Japanese Patent Laid-Open No. 2003-297952, Japanese Patent Laid-Open No. 2003-142605).

As described in Japanese Patent Laid-Open No. 2003-297952 and Japanese Patent Laid-Open No. 2003-142605, collapsing of a lower electrode can be prevented by horizontally and vertically connecting the lower electrodes of adjacent capacitors with a support film.

Meanwhile, in response to demands for higher integration of DRAMs, a technique is known for reducing memory cell size by arranging a memory cell in a layout referred to as a $6F^2$ layout (Japanese Patent Laid-Open No. 2007-287794). As described in Japanese Patent Laid-Open No. 2007-287794, a $6F^2$ memory cell structure enables an increase in capacitance by arranging capacitor elements in a closest-packing arrangement in a given area. In addition, even with a $6F^2$ memory cell, by arranging a support film that prevents collapsing of the lower electrodes of capacitor elements, capacitance can be further increased by using the sidewalls of cylindrical lower electrodes.

However, the present inventor has discovered that providing capacitor lower electrodes arranged in a closest-packing arrangement with a support film for preventing collapsing has the following problems.

FIG. 16 illustrates a schematic plan view of a case where lower electrodes of adjacent capacitors are connected and supported by linear support films extending in vertical (Y) and horizontal (X) directions as described in Japanese Patent Laid-Open No. 2003-142605. Reference numeral 101 denotes positions where lower electrodes of capacitors are to be placed. In a $6F^2$ memory cell arrangement, six lower electrodes 101 are arranged around one lower electrode 101 to form hexagon 102. Respective lower electrodes 101 are supported by support film 103 linearly extending in an X-direction and support film 104 linearly extending in a Y-direction.

Such a support film pattern can be formed by depositing silicon nitride ($Si_3N_4$) as a support film and patterning the silicon nitride using a photomask provided with openings 105 at places other than those where support films 103 and 104 are to be formed. With a support film arrangement such as that illustrated in FIG. 16, the small sizes of openings 105 cause the following problems.

Firstly, in a wet etching process for exposing the side surfaces of the lower electrodes of capacitors, the penetration velocity of a chemical (hydrofluoric acid) to an interlayer insulating film under the support film is reduced. Consequently, the support film itself ends up being exposed to the chemical over a longer period of time. Therefore, in wet etching using hydrofluoric acid, since etching of silicon nitride that makes up the support film also proceeds gradually, the extended exposure to the chemical problematically damages the support film and impairs the function of supporting the lower electrodes.

Secondly, with the generation of miniaturized elements based on a design rule of 70 nm or less, there is a problem in that it is difficult to accurately form a pattern of openings 105 with minute sizes even with a state-of-the-art exposure apparatus.

In consideration of the above, the present inventor performed an evaluation on a support film described in Japanese Patent Laid-Open No. 2003-297952 and linearly extending only in one horizontal or vertical direction but modified so as to accommodate a $6F^2$ memory cell. FIG. 17 illustrates a schematic plan view of a support film arrangement used for the evaluation. Lower electrodes 101 are arranged so as to form hexagon 102. Reference numeral 110 denotes a support film arranged so as to linearly extend in an X-direction. A linear opening pattern with approximately the same width as the support film is provided between adjacent support films 110.

With the support film arrangement illustrated in FIG. 17, the sufficiently-large area of opening portions provided in the support film solved both the first and second problems described with respect to the arrangement illustrated in FIG. 16. However, when attempting to arrange a large number of lower electrodes with high aspect ratios in the arrangement method illustrated in FIG. 17, an extended length in the X-direction of the support film fixed at both ends thereof caused new problems including curving (displacement) of the support film in the Y-direction as seen in the diagram and an occurrence of partial cracks 111 in the support film itself. Therefore, collapsing of the lower electrodes could not be prevented.

In consideration of the problems described above, the present invention provides a semiconductor device having a readily-manufactured support film with sufficient supporting strength to prevent collapsing of lower electrodes of capacitors.

SUMMARY

According to an aspect of the present invention, there is provided a semiconductor device having a $6F^2$ memory cell whose size is defined by a numerical value of a design rule F, wherein:

lower electrodes of capacitors included in the memory cell are supported by a support film;

the support film is formed as a pattern combining a first support pattern linearly extending in a first direction and a second support pattern linearly extending in a second direction that is orthogonal to the first direction;

the intervals of the first and second support patterns are both equal to or greater than 1.5F; and the interval of one of the first and second support patterns is greater than the interval of the other one of the first and second support patterns.

More specifically, one of the first and second support patterns is preferably arranged so as to have a width of 3F to 6F and an interval of 6F to 12F and the other one of the first and second support patterns is preferably arranged so as to have a width of 1.5F to 6F and an interval of 1.5F to 2.5F.

According to another aspect of the present invention, there is provided a semiconductor device having a $6F^2$ memory cell whose size is defined by a numerical value of a design rule F, wherein lower electrodes of capacitors included in the memory cell are at least supported at a portion of lateral faces thereof by a support film, the semiconductor device including a lower electrode facing an opening formed by removing the support film and supported at a portion of lateral face thereof by the support film and a lower electrode not facing the opening and supported by the support film around the entire circumference of lateral face thereof.

More specifically, preferably: the support film is formed as a pattern combining a first support pattern linearly extending in a first direction and a second support pattern linearly extending in a second direction that intersects the first direction; the support film is patterned so that the lower electrode supported by the support film around the entire circumference of the lateral face thereof is arranged on one of the first and second support patterns or intersection of both support patterns; and, in particular, one of the first and second support patterns is arranged so as to have a width of 3F to 6F and an interval of 6F to 12F and the other one of the first and second support patterns is arranged so as to have a width of 1.5F to 6F and an interval of 1.5F to 2.5F.

For a semiconductor device such as a DRAM having a $6F^2$ memory cell, collapsing of lower electrodes of capacitors during a manufacturing process can now be prevented and lower electrodes with tall heights can be readily manufactured. Therefore, even with developments in miniaturization, a memory cell of a DRAM having large-capacitance capacitor elements can be manufactured and a semiconductor device such as a DRAM featuring a large capacity and superior data storage characteristics (refresh characteristics) can be readily manufactured.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Preferred embodiments of the present invention will now be described with reference to the drawings.

Figure 1:
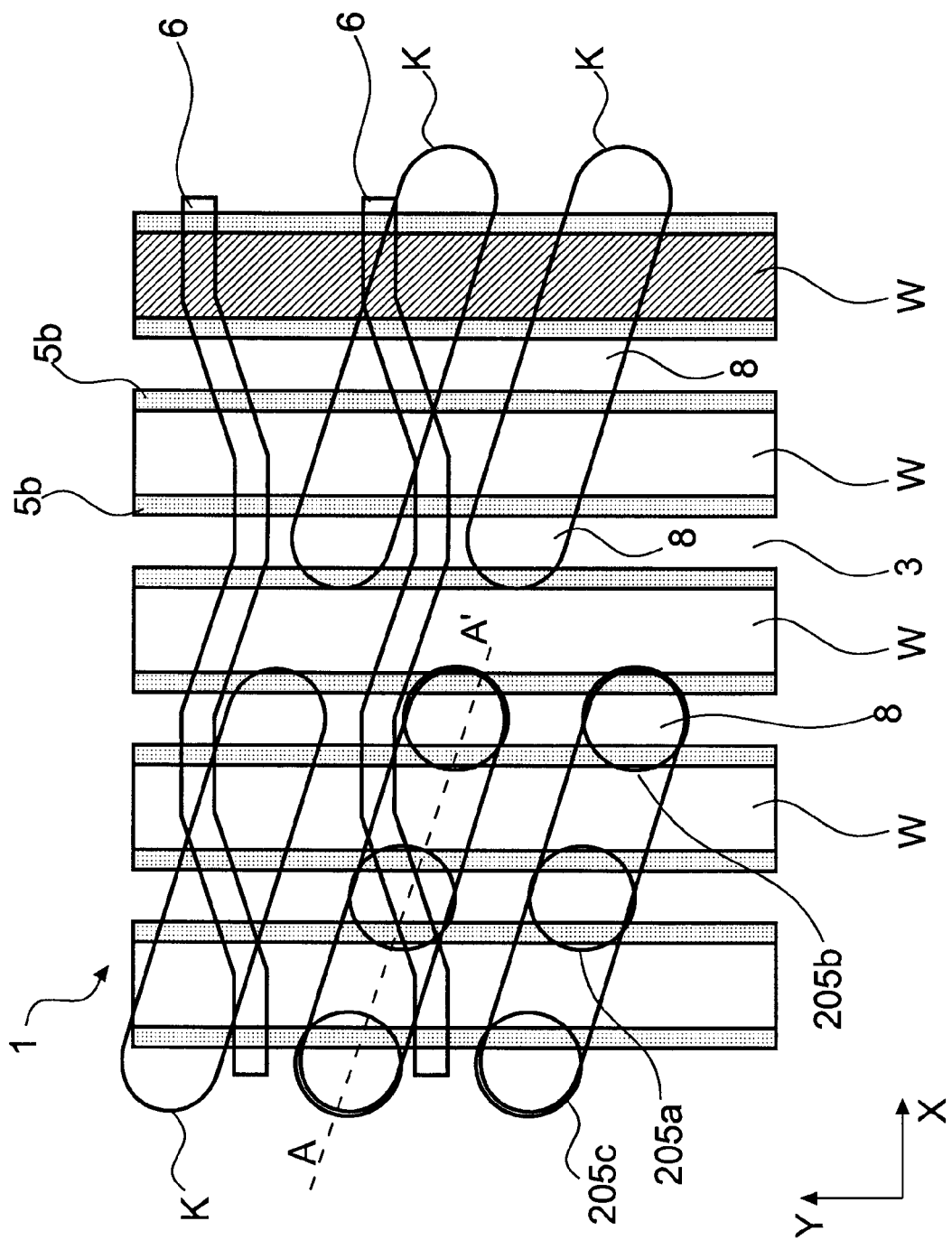
FIG. 1 is a conceptual diagram illustrating a planar structure of a memory cell part of a DRAM of a semiconductor device according to an embodiment of the present invention.

FIG. 1 is a conceptual diagram illustrating a planar structure of a memory cell part of a DRAM of a semiconductor device according to an embodiment of the present invention, and illustrates only partial components including a memory cell.

Figure 2:
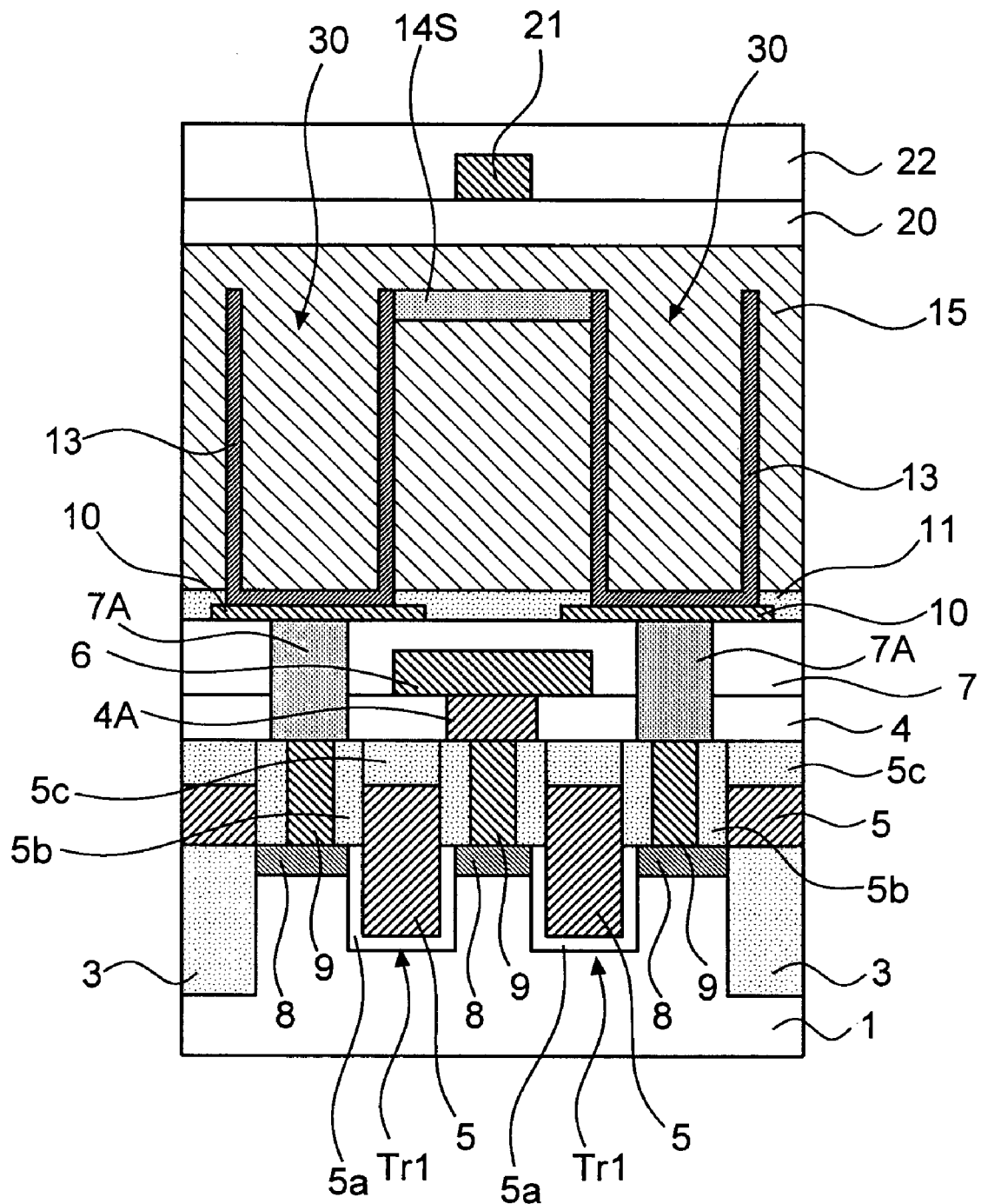
FIG. 2 is a schematic cross-sectional diagram corresponding to line A-A' in FIG. 1.

FIG. 2 is a schematic cross-sectional diagram corresponding to line A-A' in FIG. 1. The diagrams merely describe a configuration of a semiconductor device and the sizes, dimensions and the like of the respective illustrated parts may differ from the dimensional relationships of an actual semiconductor device.

As illustrated in FIG. 2, a memory cell part is generally made up of MOS transistor Tr1 for a memory cell, and capacitor element (capacitive part) 30 connected via a plurality of contact plugs to MOS transistor Tr1.

In FIGS. 1 and 2, semiconductor substrate 1 is made of silicon (Si) containing a predetermined concentration of P-type impurities. Element isolation region 3 is formed in semiconductor substrate 1. Element isolation region 3 is formed at a portion other than active region K by burying an insulating film such as a silicon oxide film ($SiO_2$) in the surface of semiconductor substrate 1 using an STI (shallow trench isolation) method, and electrically isolates adjacent active regions K. For the present embodiment, an example is shown in which the present invention is applied to a cell structure having a 2-bit memory cell arranged in one active region K.

As seen in the planar structure illustrated in FIG. 1, in the present embodiment, a plurality of elongated reed-shaped active regions K are arranged lined up diagonally downward right at predetermined intervals. Impurity diffusion layers are individually formed at both ends and at the center of each active region K, and function as source-drain regions of MOS transistor Tr1. Positions of substrate contact parts 205$a$, 205$b$, and 205$c$ are defined so as to be arranged directly above source-drain regions (impurity diffusion layers).

While arrangements of active regions K such as that illustrated in FIG. 1 are unique to the present embodiment, the shapes and alignment directions of the active regions K are not to be particularly prescribed. The active regions K illustrated in FIG. 1 may alternatively be provided with shapes of active regions applied to other conventional transistors.

Bit wiring 6 is extended and set in a polygonal line (curved shape) in a horizontal (X) direction as seen in FIG. 1. A plurality of bit wirings 6 is arranged at predetermined intervals in a vertical (Y) direction as seen in FIG. 1. In addition, linear word wiring W is arranged extending in the vertical (Y) direction as seen in FIG. 1. A plurality of word wirings W is arranged at predetermined intervals in the horizontal (X) direction as seen in FIG. 1. Word wirings W are configured so as to include gate electrodes 5 illustrated in FIG. 2 at portions intersecting respective active areas K. In the present embodiment, a case where MOS transistor Tr1 includes a recess gate electrode is shown as an example. A planar MOS transistor or a MOS transistor having a channel region formed on a lateral face portion of a trench provided on the semiconductor substrate can be used in place of the MOS transistor having the recess gate electrode.

As seen in the sectional structure illustrated in FIG. 2, on semiconductor substrate 1, impurity diffusion layers 8 that function as source-drain regions are formed separated from each other in active regions K partitioned by element isolation regions 3. Recess gate electrodes 5 are formed between respective impurity diffusion layers 8. Gate electrodes 5 are formed by a multilayer film including a polycrystalline silicon film and a metallic film so as to protrude towards the upper part of semiconductor substrate 1. The polycrystalline silicon film can be formed so as to include impurities such as phosphorus during the forming of the film using a CVD (chemical vapor deposition) method. Alternatively, N-type or P-type impurities may be introduced in a subsequent process using an ion injection method into a polycrystalline silicon film formed so as not to include impurities during the formation thereof. A refractory metal and a compound thereof such as tungsten (W), tungsten nitride (WN), and tungsten silicide (WSi) can be used as the metallic film for gate electrodes.

In addition, as illustrated in FIG. 2, gate insulating film 5a is formed between gate electrode 5 and semiconductor substrate 1. Furthermore, sidewall 5b made of an insulating film such as silicon nitride ($Si_3N_4$) is formed on the side of gate electrode 5, and cap insulating film 5c such as silicon nitride is also formed on top of gate electrode 5.

Impurity diffusion layer 8 is formed as an N-type impurity on semiconductor substrate 1 by, for example, introducing phosphorus. Substrate contact plug 9 is formed so as to come into contact with impurity diffusion layer 8. Substrate contact plugs 9 are respectively arranged at positions of substrate contact parts 205c, 205a, and 205b illustrated in FIG. 1. For example, substrate contact plugs 9 are formed of polycrystalline silicon containing phosphorus. The horizontal (X) direction widths of substrate contact plugs 9 have a self-alignment structure defined by sidewall 5b provided on adjacent gate wiring W.

As illustrated in FIG. 2, first interlayer insulating film 4 is formed so as to cover cap insulating film 5c on the top of gate electrode 5 and substrate contact plug 9, and bit line contact plug 4A is formed so as to penetrate first interlayer insulating film 4. Bit line contact plug 4A is disposed at the position of substrate contact part 205a and is in conduction with substrate contact plug 9. Bit line contact plug 4A is formed by laminating tungsten (W) or the like on top of a barrier film (TiN/Ti) made of a laminated film of titanium (Ti) and titanium nitride (TiN). Bit wiring 6 is formed so as to connect to bit line contact plug 4A. Bit wiring 6 is arranged as a laminated film made up of tungsten nitride (WN) and tungsten (W).

Second interlayer insulating film 7 is formed so as to cover bit wiring 6. Capacitor contact plug 7A is formed so as to penetrate first interlayer insulating film 4 and second interlayer insulating film 7 and to connect to substrate contact plug 9. Capacitor contact plugs 7A are disposed at the positions of substrate contact parts 205b and 205c.

Capacitor contact pad 10 is disposed on second interlayer insulating film 7 and is in conduction with capacitor contact plug 7A. Capacitor contact pad 10 is formed by a laminated film made up of tungsten nitride (WN) and tungsten (W).

Third interlayer insulating film 11 using silicon nitride is formed so as to cover capacitor contact pad 10.

Capacitor element 30 is formed so as to penetrate third interlayer insulating film 11 and to connect to capacitor contact pad 10.

Capacitor element 30 is structured such that a capacitor insulating film (not illustrated) is sandwiched between lower electrode 13 and upper electrode 15, wherein lower electrode 13 is in conduction with capacitor contact pad 10. In addition, supporting part 14S is formed by a support film formed so as to come into contact with a lateral face of an upper end of lower electrode 13 and supports lower electrode 13 during a manufacturing process so as to prevent lower electrode 13 from collapsing.

Capacitor elements for storage operations are not disposed in regions (e.g., peripheral circuit regions) other than memory cell parts of the DRAM. A fourth interlayer insulating film (not illustrated) formed of silicon oxide or the like is formed over third interlayer insulating film 11.

Formed over capacitor element 30 at memory cell parts are fifth interlayer insulating film 20, upper wiring layer 21 formed of aluminum (Al), copper (Cu) or the like, and surface protective film 22.

Next, a semiconductor device manufacturing method according to the present embodiment will be described with reference to FIGS. 3 to 11. FIGS. 3 to 11 are schematic cross-sectional diagrams corresponding to line A-A' of a memory cell part (FIG. 1).

Figure 3:
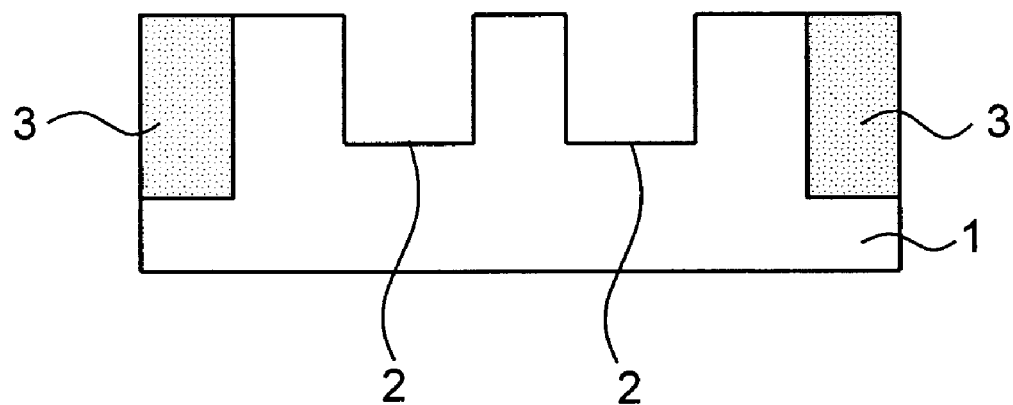
FIGS. 3 to 11 are schematic cross-sectional diagrams describing a process in a semiconductor device manufacturing method according to an embodiment of the present invention.

As illustrated in FIG. 3, since active regions K are partitioned on a primary face of semiconductor substrate 1 made of P-type silicon, element isolation regions 3 in which is buried an insulating film such as silicon oxide ($SiO_2$) is formed by STI at sections other than the active regions K.

Next, groove pattern 2 for gate electrodes of MOS transistor Tr1 is formed. Groove pattern 2 is formed by etching the silicon of semiconductor substrate 1 using, as a mask, a pattern (not illustrated) formed with a photoresist.

Figure 4:
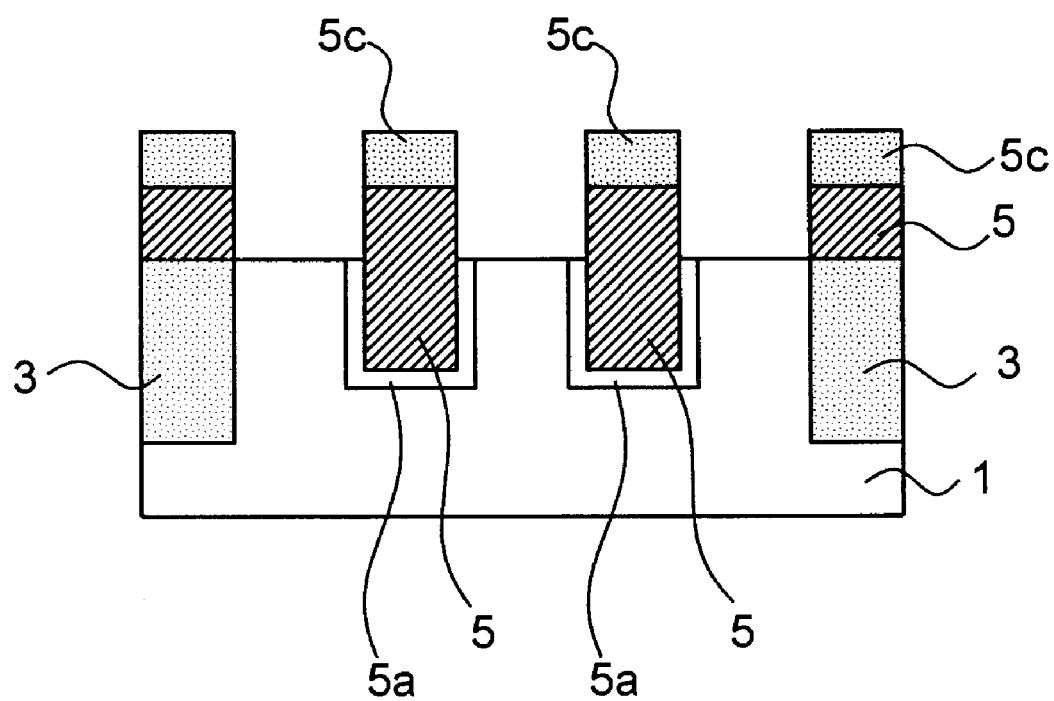

Next, as illustrated in FIG. 4, gate insulating film 5a with a thickness of around 4 nm is formed in a transistor forming region by oxidizing the silicon surface of semiconductor substrate 1 into silicon oxide by thermal oxidation. A laminated film made up of silicon oxide and silicon nitride or a high-k film (high dielectric film) can be used as the gate insulating film.

Subsequently, a polycrystalline silicon film containing phosphorus as an N-type impurity is deposited on gate insulating film 5a by CVD with silane ($SiH_4$) and phosphine ($PH_3$) as base gases. When doing so, film thickness is set such that the interior of groove pattern 2 for gate electrodes is completely filled with the polycrystalline silicon film. Alternatively, a polycrystalline silicon film not containing impurities such as phosphorus may be formed, whereby a desired impurity is introduced into the polycrystalline silicon film in a subsequent process by ion injection. Next, refractory metal such as tungsten, tungsten nitride, and tungsten silicide is deposited to a thickness of around 50 nm on the polycrystalline silicon film as the metallic film by sputtering. The polycrystalline silicon film and the metallic film are formed into gate electrodes 5 through a process described later.

Cap insulating film 5c made of silicon nitride is deposited to a thickness of around 70 nm on the metallic film to make up gate electrode 5 using a plasma CVD method with silane and ammonia ($NH_3$) as base gases. A photoresist (not illustrated)

is then applied on cap insulating film 5c and a photoresist pattern for forming gate electrodes 5 is formed by photolithography using a mask for forming gate electrodes 5.

Using the photoresist pattern as a mask, cap insulating film 5c is etched by anisotropic etching. After removing the photoresist pattern, the metallic film and the polycrystalline silicon film are etched using cap insulating film 5c as a hard mask to form gate electrodes 5. Gate electrode 5 functions as word line W (FIG. 1).

Figure 5:
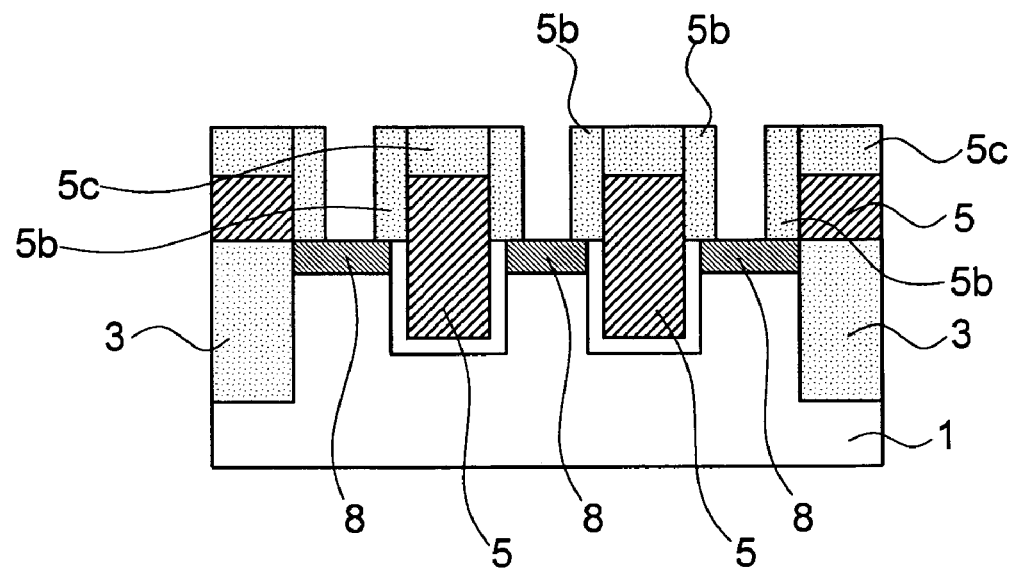

Next, as illustrated in FIG. 5, ion injection of phosphorus as an N-type impurity is performed and impurity diffusion layer 8 is formed in active region K not covered by gate electrode 5.

Subsequently, sidewall 5b is formed on a sidewall of gate electrode 5 by depositing a silicon nitride film over the entire surface to a thickness of around 20 to 50 nm by CVD and performing etch-back.

Figure 6:
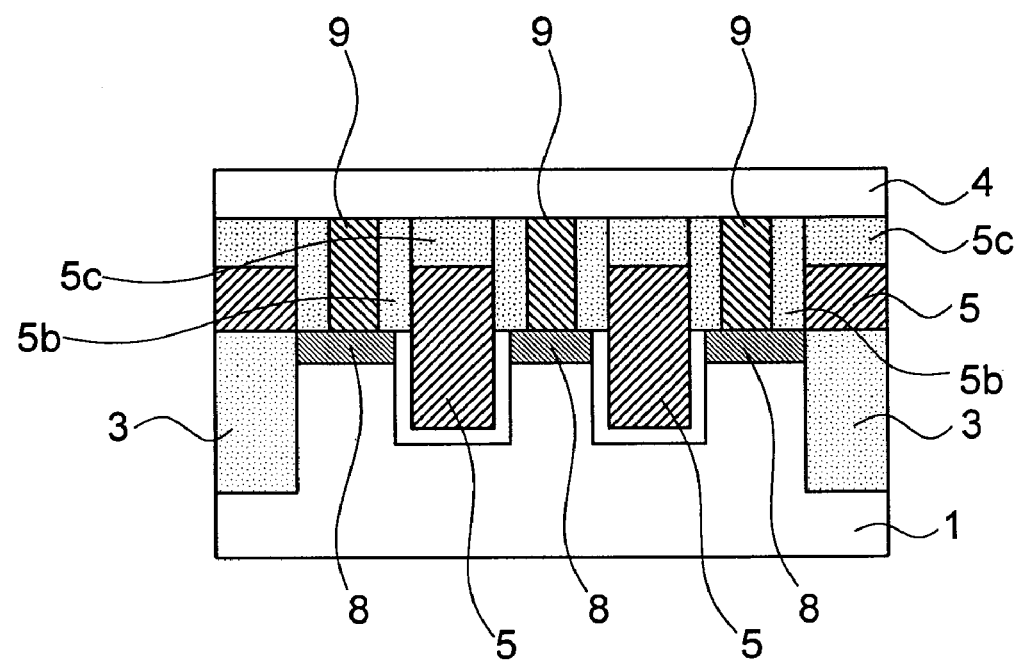

After forming an interlayer insulating film (not illustrated) such as silicon oxide by CVD so as to cover cap insulating film 5c on the top of the gate electrode and sidewall 5b, the surface is polished by a CMP (chemical mechanical polishing) method in order to smooth irregularities originating from gate electrode 5. Surface polishing is suspended once an upper face of cap insulating film 5c on the gate electrode is exposed. Subsequently, substrate contact plug 9 is formed as illustrated in FIG. 6. Specifically, etching is first performed using the pattern formed with the photoresist as a mask so as to form openings at the positions of substrate contact parts 205a, 205b, and 205c illustrated in FIG. 1 to remove the interlayer insulating film formed earlier. Openings can be provided between gate electrodes 5 by self-alignment using cap insulating film 5c and sidewall 5b formed by silicon nitride. Subsequently, after depositing a polycrystalline silicon film containing phosphorus by CVD, polishing is performed by CMP, and the polycrystalline silicon film on cap insulating film 5c is removed to obtain substrate contact plugs 9 filling the openings.

First interlayer insulating film 4 made of silicon oxide is then formed by CVD to a thickness of, for example, around 600 nm so as to cover cap insulating film 5c on the top of the gate electrode and substrate contact plug 9. The surface of first interlayer insulating film 4 is then polished and smoothed by CMP until a thickness of, for example, around 300 nm is obtained.

Figure 7:
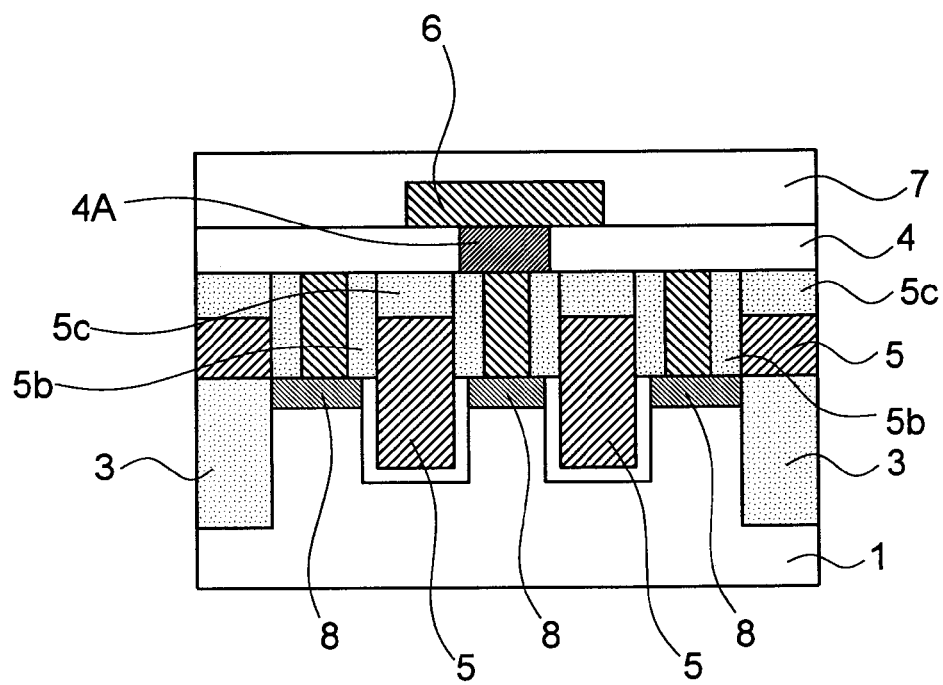

Next, as illustrated in FIG. 7, an opening (contact hole) is formed at the position of substrate contact part 205a illustrated in FIG. 1 on first interlayer insulating film 4 so as to expose the surface of substrate contact plug 9. A tungsten (W) film is deposited on a barrier film such as TiN/Ti so as to fill the inside of the opening, whereby the surface of the deposited film is polished by CMP to form bit line contact plug 4A.

Subsequently, bit wiring 6 is formed so as to connect to bit line contact plug 4A.

Second interlayer insulating film 7 is formed using silicon oxide or the like so as to cover bit wiring 6.

Figure 8:
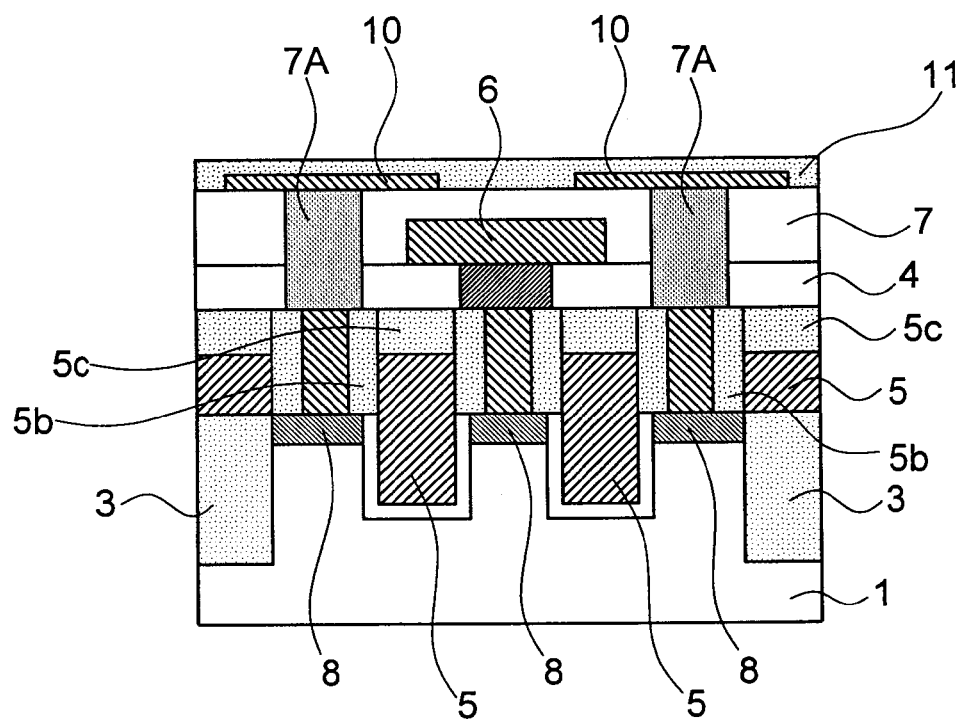

Next, as illustrated in FIG. 8, openings (contact holes) are formed at the positions of substrate contact parts 205b and 205c illustrated in FIG. 1 so as to penetrate first interlayer insulating film 4 and second interlayer insulating film 7 to expose the surface of substrate contact plugs 9. A tungsten (W) film is deposited on a barrier film such as TiN/Ti so as to fill the inside of the openings, whereby the surface of the deposited film is polished by CMP to form capacitor contact plugs 7A.

Capacitor contact pad 10 is formed on second interlayer insulating film 7 using a laminated film containing tungsten. Capacitor contact pad 10 is in conduction with capacitor contact plug 7A and is disposed with a size greater than that of a bottom part of a lower electrode of a capacitor element to be formed later.

Subsequently, third interlayer insulating film 11 is deposited to a thickness of, for example, 60 nm using silicon nitride so as to cover capacitor contact pad 10.

Figure 9:
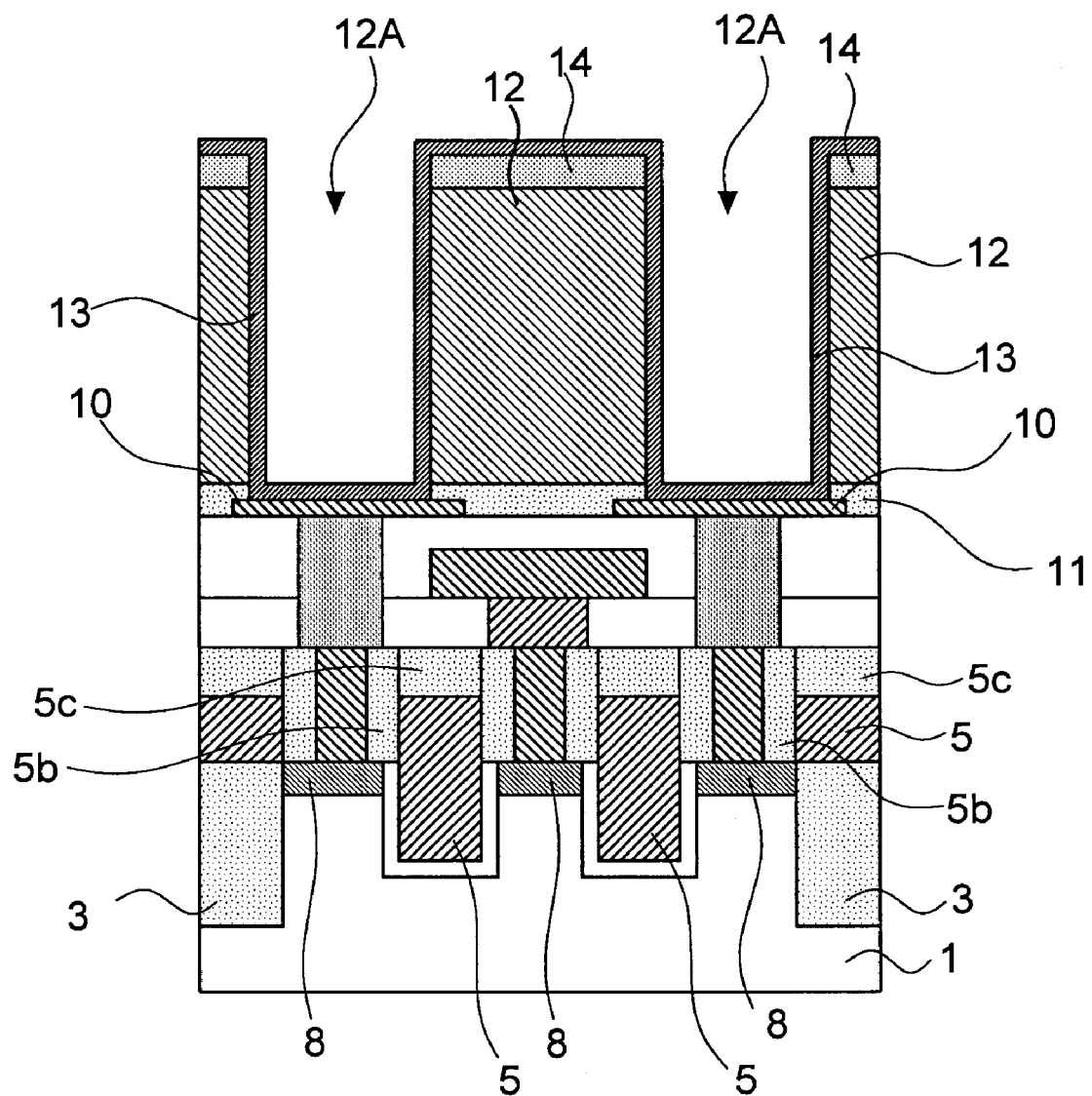

Next, as illustrated in FIG. 9, fourth interlayer insulating film 12 is deposited using silicon oxide or the like as a sacrificial interlayer film to a thickness of, for example, 2 μm. Support film 14 formed by silicon nitride is deposited on fourth interlayer insulating film 12 to a thickness of, for example, 100 nm.

Figure 12:
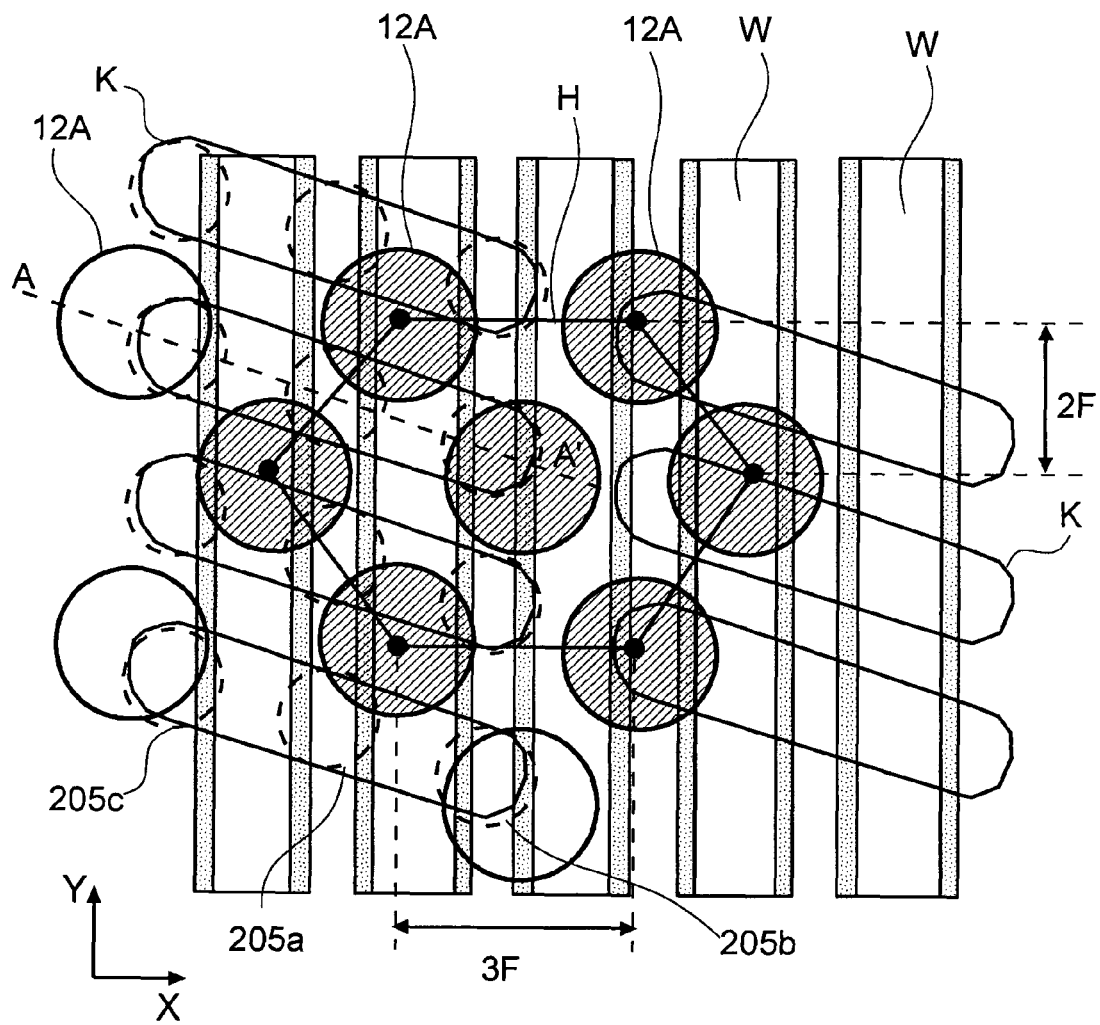
FIG. 12 is a plan view illustrating general locations at which capacitor elements are to be formed.

Subsequently, opening (capacitor hole) 12A is formed by anisotropic dry etching at a position where a capacitor element is to be formed to expose the surface of capacitor contact pad 10. A plan view of approximate positions where capacitor elements are to be formed is illustrated in FIG. 12. In FIG. 12, lower electrodes of capacitor elements are formed at positions of openings 12A. Illustrations of capacitor contact pads and bit wirings have been omitted in FIG. 12. With a $6F^2$ memory cell, by appropriately arranging the positions of capacitor contact pads, openings 12A can be disposed so as to achieve a closest-packing arrangement. In this case, center positions of openings 12A form hexagon H as illustrated in FIG. 12. Using numerical value F (feature size) of a design rule defining the size of a $6F^2$ memory cell, the center-to-center distance between adjacent lower electrodes may be expressed as a product $6F^2$ of an X-direction 3F and a Y-direction 2F. Numerical value F is a value corresponding to a minimum processing dimension in a manufacturing process.

After openings 12A are formed, lower electrodes 13 of capacitor elements are formed. Specifically, titanium nitride is deposited to a thickness that does not completely fill the insides of openings 12A. Metallic films other than titanium nitride can be used as the material for the lower electrodes.

Figure 10:
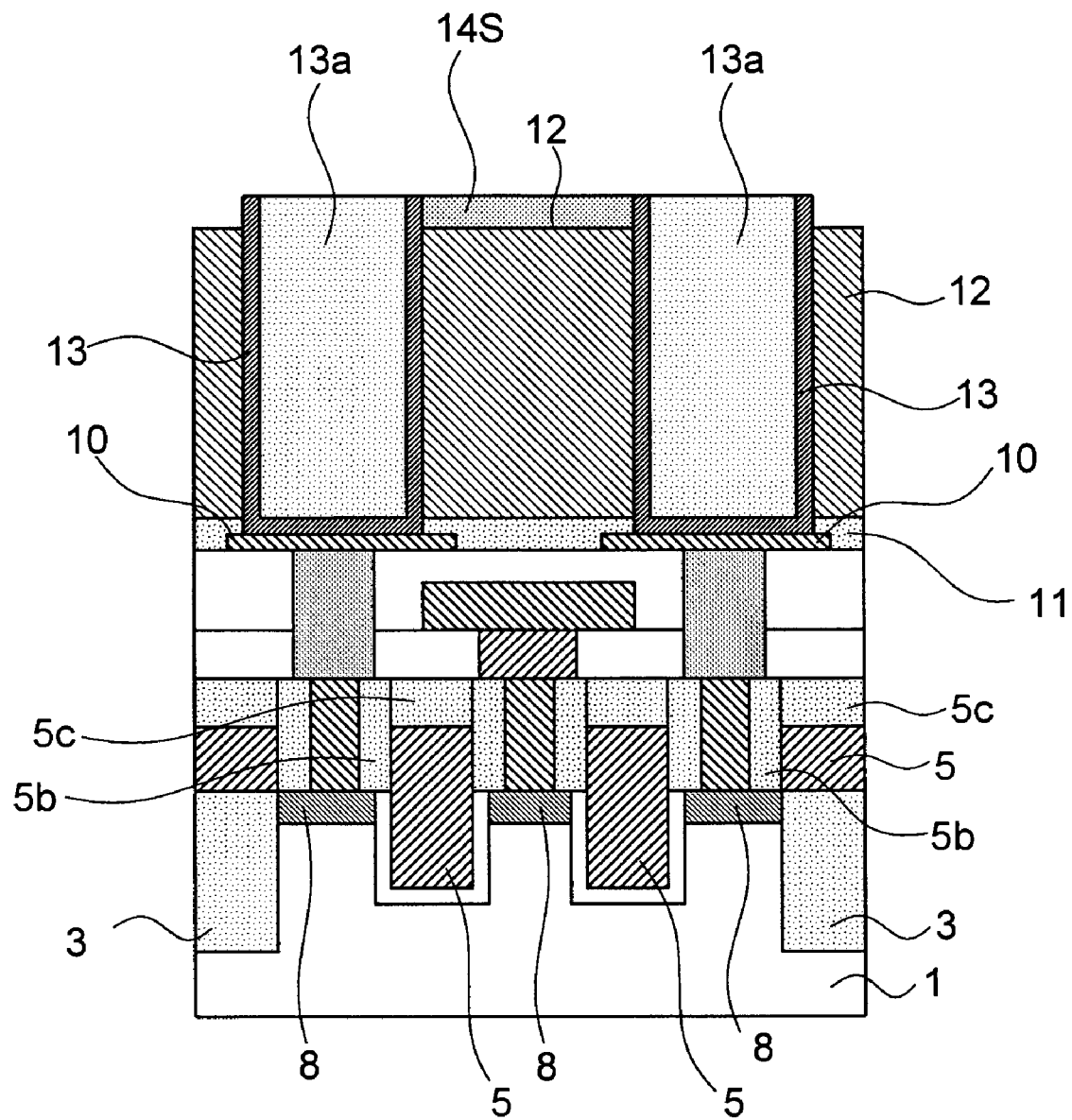
Figure 13:
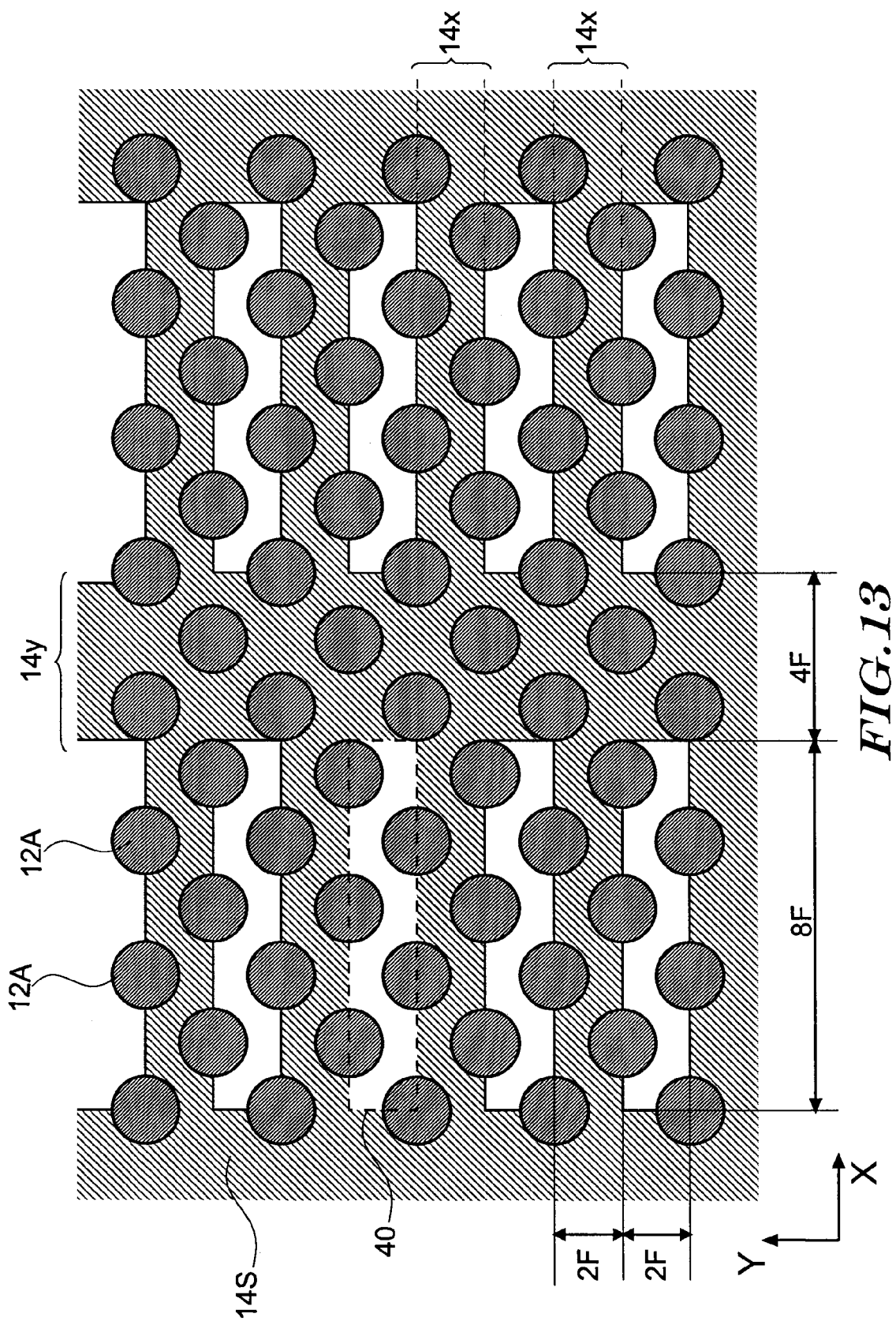
FIG. 13 is a plan view illustrating an example of a support pattern.

Next, as illustrated in FIG. 10, the titanium nitride (13) on fourth interlayer insulating film 12 is removed by dry etching or CMP. When doing so, openings 12A are to be filled with protective film 13a such as silicon oxide in order to protect the lower electrodes in the inside of openings 12A. Subsequently, support film 14 is patterned by anisotropic dry etching and supporting part 14S is formed. A plan view of an approximate position where supporting part 14S is to be formed is illustrated in FIG. 13. FIG. 13 schematically illustrates only positions of capacitor lower electrodes 13 (positions of openings 12A). In the present embodiment, using numerical value F of a design rule that defines the size of a $6F^2$ memory cell, lower electrodes are arranged in the X-direction at 3F pitches. Support film 14 is patterned so as to have opening 40 with a Y-direction width of 2F and an X-direction width of 8F, and is made into supporting part 14S including pattern width 14x having a of 2F and linearly extending in the X-direction and pattern 14y having a width of 4F and linearly extending in the Y-direction. Pattern 14x extending in the X-direction supports lower electrodes by contacting a portion (in FIG. 13, half of the circumference of opening 12A) of lower electrodes 13. With respect to the patterning of the support film, the sufficiently large size of 2F×8F of opening 40 enables a pattern to be readily formed by exposure using a photoresist film. In addition, the patterning of such a support film forms a portion (vicinity of a central portion of support pattern 14y) in which a lower electrode is not facing opening 40 and the entire circumference of a lateral face of the lower electrode is supported by the support film and a portion (a portion in which opening 40 is formed) in which a lower electrode is facing opening 40 and a partial circumference of a lateral face of the lower electrode is supported by the support film. Furthermore, in the portion in which a lower electrode is facing opening 40 and a partial circumference of a lateral face of the lower electrode is supported by the support film, the support film preferably continuously supports ⅓ or more or, more preferably, ½ or more of the entire circumference of the lateral face of the lower electrode.

Figure 11:
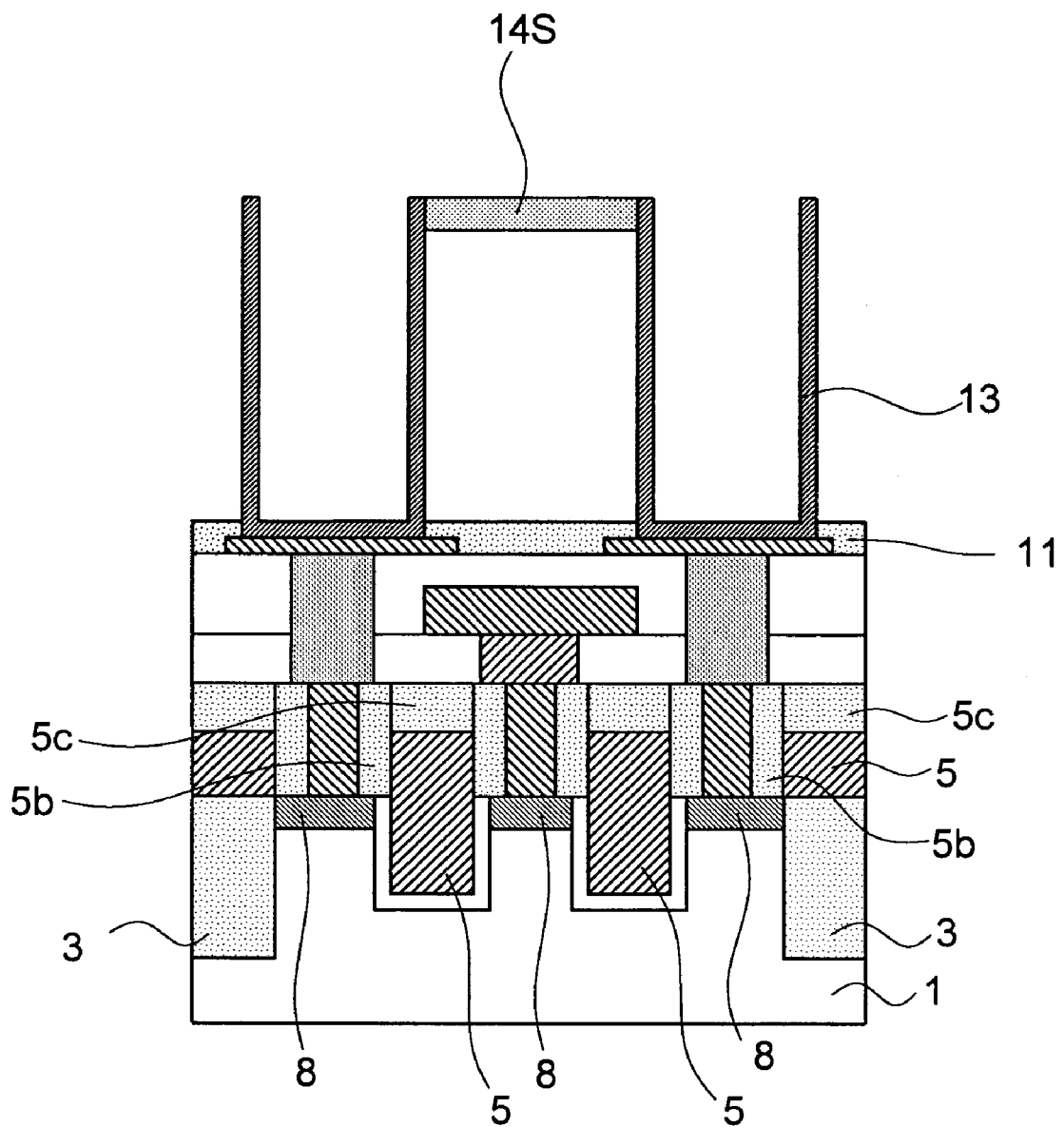

Next, as illustrated in FIG. 11, wet etching using hydrofluoric acid (HF) is performed to remove fourth interlayer insulating film 12 and protective film 13a of the memory cell part so as to expose inner and outer walls of lower electrode 13. Third interlayer insulating film 11 formed of silicon nitride functions as a stopper film during the wet etching and prevents elements and the like positioned at a lower layer from being subjected to etching. In addition, by preserving support film 14 deposited on the upper face of fourth interlayer insulating film 12 in regions other than the memory cell part, chemical penetration can be prevented during wet etching.

Furthermore, as protective film 13a, a material that can be wet-etched at an etching speed significantly higher (e.g., five times faster) than that of a silicon oxide film such as an SOG film is preferably used because protective film 13a will be completely removed when removing fourth interlayer insulating film 12.

Figure 16:
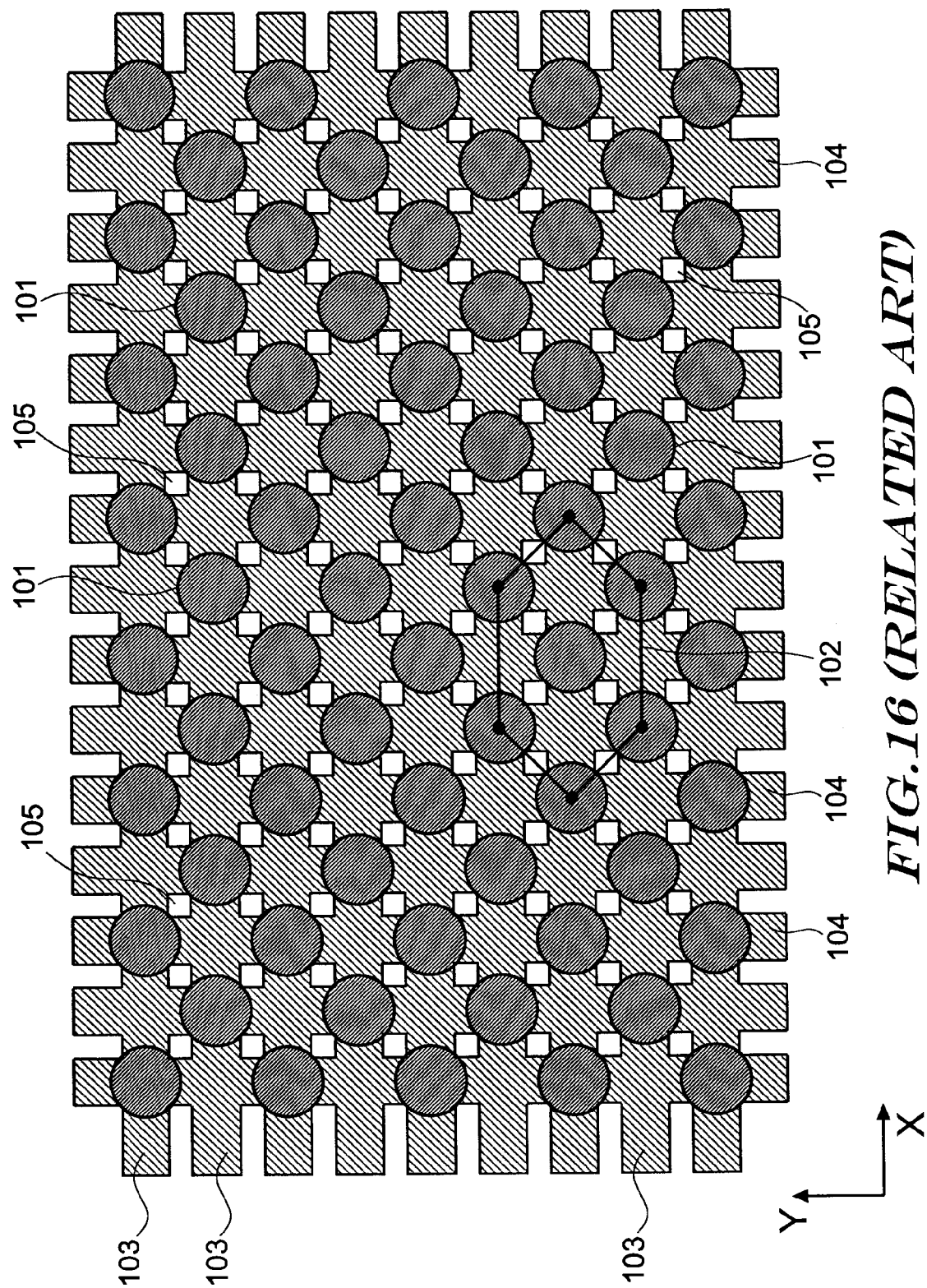
FIG. 16 is a plan view illustrating an example in which a conventional support pattern is applied to a $6F^2$ memory cell.
Figure 17:
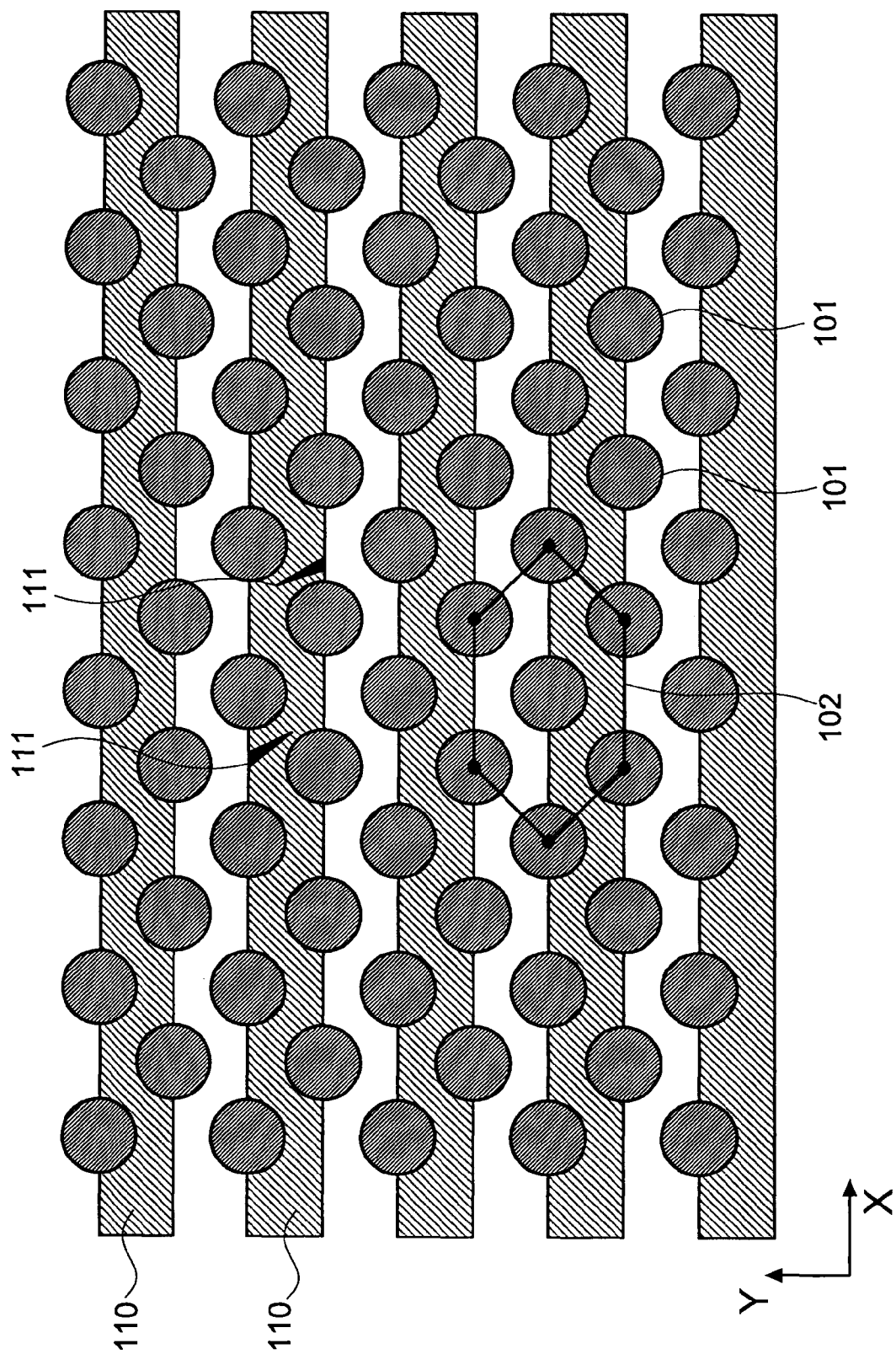
FIG. 17 is a plan view illustrating an example in which another support pattern of related art is applied to a $6F^2$ memory cell.

In the present embodiment, since the size of opening 40 formed in support film 14 is large, chemical penetration during wet etching can be performed in a shorter period of time than what is conventional (FIG. 16). Therefore, a decrease in supporting strength due to damages of the support film sustained from the chemical (hydrofluoric acid) can be suppressed. In addition, as illustrated in FIG. 13, supporting part 14S includes the pattern extending in the Y-direction (14y) in addition to the pattern extending in the X-direction (14x). Therefore, lower electrodes 13 can be supported more rigidly than what is conventional (FIG. 17), thereby enabling prevention of curving (displacement) of the support film in the Y-direction or occurrences of partial cracks in the support film itself which have conventionally been considered problematic. Accordingly, during wet etching, collapsing of lower electrode 13 can be prevented without reducing the strength of supporting part 14S for supporting lower electrodes thereby.

Next, a capacitor insulating film (not illustrated) is formed so as to cover the sidewall surface of lower electrode 13. For example, a high dielectric film made of hafnium oxide ($HfO_2$), zirconium oxide ($ZrO_2$) or aluminum oxide ($Al_2O_3$), or a laminated body thereof can be used as the capacitor insulating film.

Next, as illustrated in FIG. 2, upper electrode 15 of the capacitor element is formed by titanium nitride or the like. Capacitor element 30 is formed by sandwiching the capacitor insulating film with lower electrode 13 and upper electrode 15.

Subsequently, fifth interlayer insulating film 20 is formed by silicon oxide or the like. A leading contact plug (not illustrated) for applying potential to upper electrode 15 of the capacitor element is formed at the memory cell part.

Upper wiring layer 21 is then formed by aluminum (Al), copper (Cu), or the like. Furthermore, forming surface protective film 22 by silicon oxynitride (SiON) or the like completes the memory cell part of the DRAM.

Next, a modification of the present embodiment will be described.

In the present invention, the support film pattern is not limited to the shape illustrated in FIG. 13.

In addition, the arrangement of supporting part 14S is defined only by the positional relationship with lower electrodes 13 and may be set independent of the arrangements of transistors and the like positioned on a lower layer than the lower electrodes.

In FIG. 13, an excessive increase in the size of opening 40 results in a decrease in the strength for supporting lower electrodes 13. Therefore, using numerical value F of a design rule defining the size of a $6F^2$ memory cell, opening 40 is preferably set so as to be equal to or greater than 6F and equal to or smaller than 12F in the X-direction and equal to or greater than 1.5F and equal to or smaller than 2.5F in the Y-direction. In other words, the size of opening 40 provided in the support film is preferably set so as to fall within a range of 6F to 12F, inclusive, in the X-direction and to fall within a range of 1.5F to 2.5F, inclusive, in the Y-direction.

Figure 14:
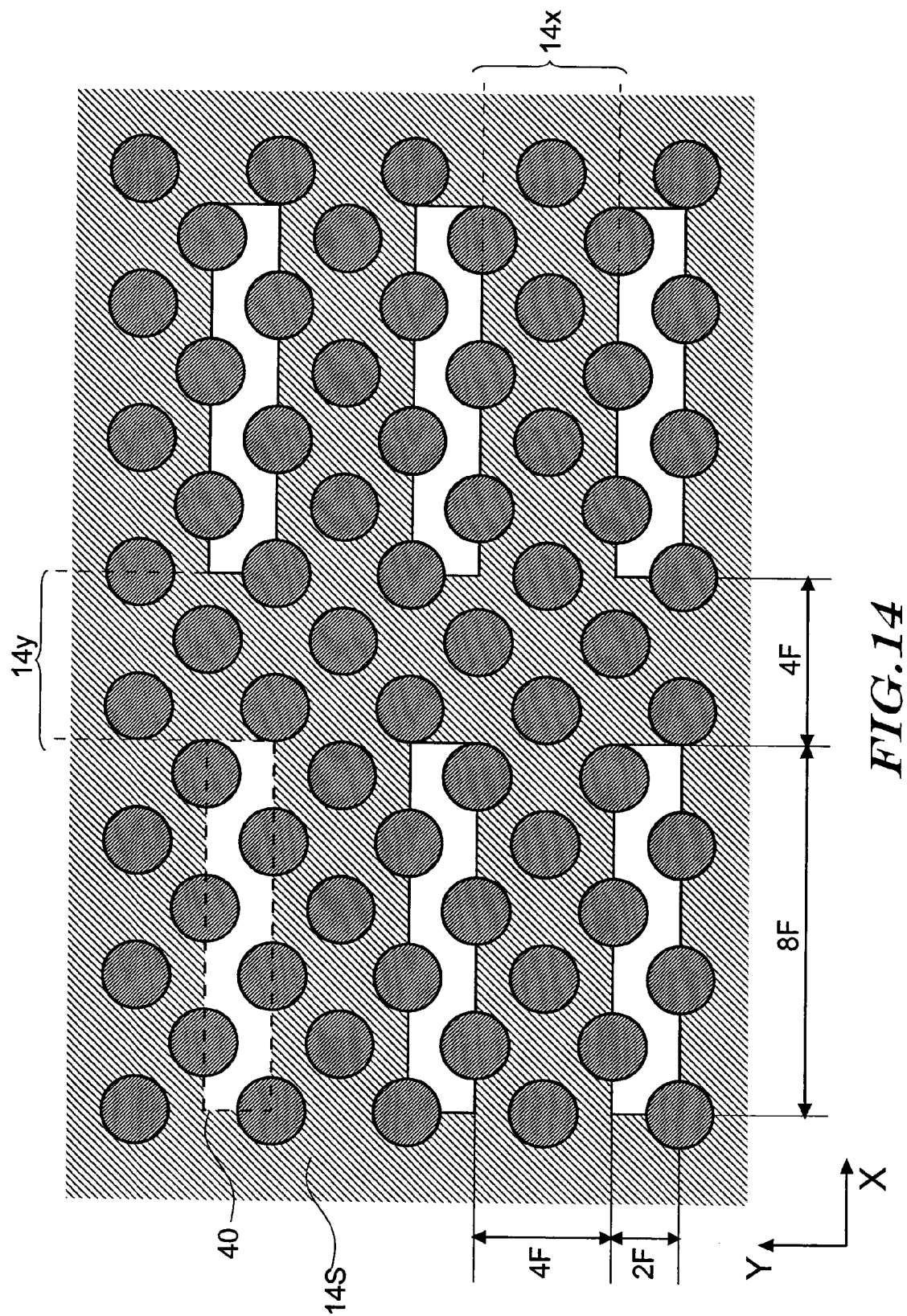
FIG. 14 is a plan view illustrating another example of a support pattern.

In addition, the width of linear support pattern 14x extending in the X-direction may be set to 4F as illustrated in FIG. 14. By increasing the width of linear support pattern 14x, the strength of the supporting part can be increased but the total area of opening 40 is reduced. Therefore, linear supporting pattern 14x is preferably set so that an appropriate value is obtained within a range of 1.5F to 6F in accordance with wet etching conditions during exposure of the lateral face of a lower electrode. In this example, the support film is formed so that lower electrodes, whose entire circumference of a lateral face of each one is supported by the support film, coexist in both the X and Y directions.

In addition, while the width of linear support pattern 14y extending in the Y-direction is also not restricted to 4F, the width is preferably appropriately set within a range from 3F to 6F.

Furthermore, since the pattern of supporting part 14S is defined only by the positional relationship with the lower electrodes, an arrangement in which the X and Y directions are interchanged can also be adopted.

Figure 15:
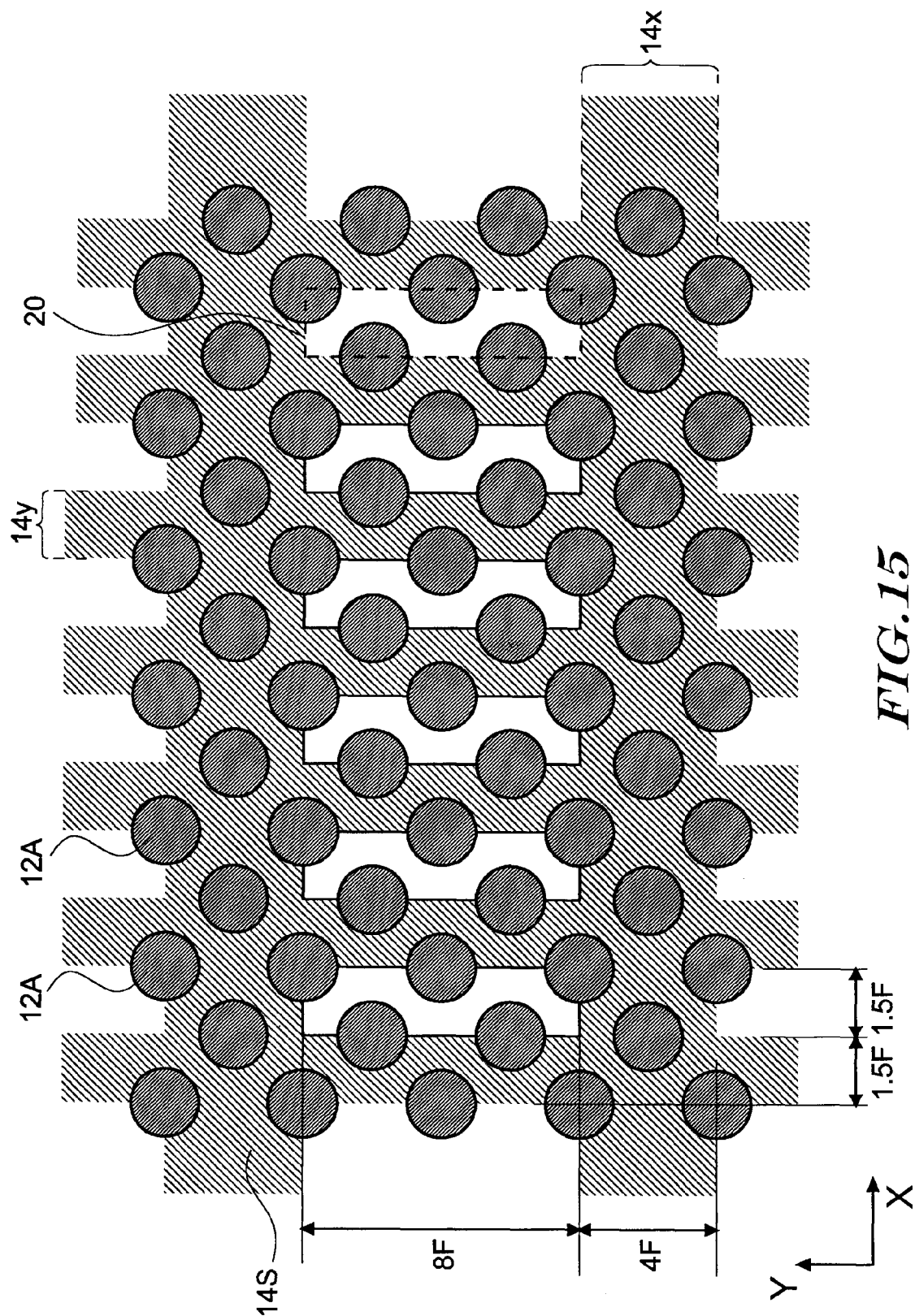
FIG. 15 is a plan view illustrating yet another example of a support pattern.

FIG. 15 illustrates a plan view of a case where supporting part 14S is formed by interchanging the X and Y directions.

The size of opening 40 is formed such that the X-direction width thereof is 1.5F and the Y-direction width thereof is 8F. In addition, the size of supporting part 14S is set such that the portion extending in the X-direction (14x) has a width of 4F and the portion extending in the Y-direction (14y) has a width of 1.5F.

Even in this case, the widths of opening 40 and supporting part 14S are not exclusively restricted to the values illustrated in FIG. 15. The widths of opening 40 and supporting part 14S may be varied so that the opening takes a rectangular shape.

In the present invention, lower electrodes are arranged so as to be supported by a supporting part (support film) extending in the two directions of X and Y, and an opening provided on the support film is shaped in a rectangle. Accordingly, patterning of the support film can be readily performed, and by increasing the penetration velocity of a chemical during wet etching, damages of the support film sustained by wet etching can be suppressed. In addition, since force applied to the support film can be dispersed by providing support from two directions, deformation of the support film itself and occurrences of cracks can be avoided. Consequently, collapsing of lower electrodes can be prevented.

Furthermore, while a case where the support film was positioned so as to come into contact with an upper end portion of a lower electrode has been described in the embodiments above, a supporting part (support film) may be formed so as to come into contact with a lateral face portion of the lower electrode at a position lower than the upper end thereof. In this case, fourth interlayer film 12 can be provided with a double layer structure, whereby after depositing a first layer, laminating support film 14 and performing patterning to a predetermined shape, a second interlayer insulating film is deposited before forming capacitors in a similar manner.

While the above description features an example of forming a cylindrical lower electrode and subsequently forming an upper electrode via a capacitor insulating film that ranges from an inner wall face to an outer wall face of the lower electrode, the present invention is not limited to this example and is similarly effective when forming a pillar-type (solid column) lower electrode. In forming a pillar-type lower electrode, a material of the lower electrode is deposited in the capacitor hole so as to fill completely into the capacitor hole, and the material of the lower electrode outside the capacitor hole is removed.

In addition, an outer shape of the lower electrode is not limited to a circle in plan view. The outer shape of the lower electrode may form such as a polygonal shape, a rectangular shape and a square shape in plan view.

Furthermore, the directions in which the supporting part extends are not necessarily restricted to the X and Y directions as depicted in the drawings. For example, the supporting part may be formed by arranging the first support pattern to extend in a bottom-left to top-right direction and the second support pattern to extend in a bottom-right to top-left direction so as to intersect each other. When the first support pattern extends in a first direction and the second support pattern extends in the second direction, the second direction is not limited to be perpendicular to the first direction. The second direction may set so as to cross the first direction in any angles.

Even in this case, the object of the present invention can be achieved by arranging the arrangement interval of the first support pattern and the arrangement interval of the second support pattern to differ from each other.

What is claimed is:

1. A semiconductor device comprising a $6F^2$ memory cell whose size is defined by a numerical value of a design rule F, wherein:
    lower electrodes of capacitors included in the memory cell are at least supported at a portion of an outer side face thereof by a support film;
    the support film is formed as a pattern combining a first support pattern linearly extending in a first direction and a second support pattern linearly extending in a second direction that crosses to the first direction;
    the intervals of the first and second support patterns are both equal to or greater than 1.5F; and
    the interval of one of the first and second support patterns is greater than the interval of the other one of the first and second support patterns.

2. The semiconductor device according to claim 1, wherein the first direction is perpendicular to the second direction.

3. The semiconductor device according to claim 1, wherein one of the first and second support patterns is arranged so as to have a width of 3F to 6F and an interval of 6F to 12F and the other one of the first and second support patterns is arranged so as to have a width of 1.5F to 6F and an interval of 1.5F to 2.5F.

4. The semiconductor device according to claim 1, wherein the support film is arranged so as to come into contact with at least a portion of upper-end outer side faces of the lower electrodes.

5. A semiconductor device comprising:
    a memory cell region including a plurality of memory cells, each of the memory cells having a capacitor belonging to a first group or a second group; and
    a support film to hold lower electrodes of the capacitors, the support film having a plurality of openings formed by removing a part of the support film, wherein
    each of the memory cells is disposed in the memory cell region by $6F^2$ layout whose size is defined by a numerical value of a design rule F, each of the capacitors belonging to the first group exposes a part of an outer side face of the lower electrode to the opening of the support film, and each of the capacitors belonging to the second group dose not expose an outer side face of the lower electrode to the opening of the support film.

6. The semiconductor device according to claim 5, wherein the support film is formed by a pattern combining a first support pattern linearly extending in a first direction and a second support pattern linearly extending in a second direction that intersects the first direction, and the support film is patterned so that the lower electrode supported by the support film around the entire circumference of the portion of the outer side face is arranged on one of the first and second support patterns or intersection of both support patterns.

7. The semiconductor device according to claim 6, wherein one of the first and second support patterns is arranged so as to have a width of 3F to 6F and an interval of 6F to 12F and the other one of the first and second support patterns is arranged so as to have a width of 1.5F to 6F and an interval of 1.5F to 2.5F.

8. The semiconductor device according to claim 5, wherein the lower electrode is continuously supported by the support film with ⅓ or more of the entire circumference of the outer side face thereof.

9. The semiconductor device according to claim 5, wherein the support film is arranged so as to come into contact with at least a portion of upper-end outer side faces of the lower electrodes.

10. The semiconductor device according to claim 5, wherein the support film contacts to the lower electrodes at a level without an upper-end level of the lower electrodes.

11. A method of manufacturing a semiconductor device having a $6F^2$ memory cell whose size is defined by a numerical value of a design rule F, the method comprising:
    forming a support film on a sacrificial interlayer film;
    forming a capacitor hole penetrating the support film and the sacrificial interlayer film;
    forming a lower electrode of a capacitor inside the capacitor hole;
    patterning the support film so as to have a pattern combining a first support pattern linearly extending in a first direction and a second support pattern linearly extending in a second direction that crosses to the first direction, the intervals of the first and second support patterns both equal to or greater than 1.5F, and the interval of one of the first and second support patterns greater than the interval of the other one of the first and second support patterns; and
    selectively removing the sacrificial interlayer film via an opening formed between patterns of the support film.

12. The method of manufacturing a semiconductor device according to claim 11, wherein patterning is performed so that one of the first and second support patterns has a width of 3F to 6F and an interval of 6F to 12F and the other one of the first and second support patterns has a width of 1.5F to 6F and an interval of 1.5F to 2.5F.

13. The method of manufacturing a semiconductor device according to claim 11, wherein the support film is formed at a position supporting an upper end of the lower electrode, and the patterning of the support film is performed after forming the lower electrode inside the capacitor hole.

14. The method of manufacturing a semiconductor device according to claim 11, wherein the lower electrode is formed by depositing a material of the lower electrode in the capacitor hole to a film thickness that does not completely fill the inside of the capacitor hole, by filling the remainder of the hole with a protective film, and then by planarizing, and the protective film is simultaneously removed when selectively removing the sacrificial interlayer film.

15. The method of manufacturing a semiconductor device according to claim 11, wherein the lower electrode is formed by depositing a material of the lower electrode in the capacitor hole so as to fill completely into the capacitor hole, and the material of the lower electrode outside the capacitor hole is removed.

* * * * *